US008233309B2

(12) United States Patent
Fasoli

(10) Patent No.: US 8,233,309 B2
(45) Date of Patent: Jul. 31, 2012

(54) NON-VOLATILE MEMORY ARRAY ARCHITECTURE INCORPORATING 1T-1R NEAR 4F² MEMORY CELL

(75) Inventor: Luca G. Fasoli, Campbell, CA (US)

(73) Assignee: SanDisk 3D LLC, Milpitas, CA (US)

( * ) Notice: Subject to any disclaimer, the term of this patent is extended or adjusted under 35 U.S.C. 154(b) by 359 days.

(21) Appl. No.: 12/606,111

(22) Filed: Oct. 26, 2009

(65) Prior Publication Data

US 2011/0096588 A1    Apr. 28, 2011

(51) Int. Cl.
*G11C 11/00* (2006.01)
(52) U.S. Cl. ............... 365/148; 365/72; 365/63; 365/51
(58) Field of Classification Search .................. 365/148, 365/158, 163, 171, 173, 51, 63, 72
See application file for complete search history.

(56) References Cited

U.S. PATENT DOCUMENTS

| | | | |
|---|---|---|---|
| 3,761,896 A | 9/1973 | Davidson | |
| 5,541,869 A | 7/1996 | Rose et al. | |
| 5,625,586 A * | 4/1997 | Yamasaki et al. | 365/104 |
| 5,896,312 A | 4/1999 | Kozicki et al. | |
| 5,915,167 A | 6/1999 | Leedy | |
| 6,072,716 A | 6/2000 | Jacobson et al. | |
| 6,385,074 B1 | 5/2002 | Johnson et al. | |
| 6,473,332 B1 | 10/2002 | Ignatiev et al. | |
| 6,545,898 B1 | 4/2003 | Scheuerlein | |
| 6,618,295 B2 | 9/2003 | Scheuerlein | |
| 6,711,068 B2 | 3/2004 | Subramanian et al. | |
| 6,735,104 B2 | 5/2004 | Scheuerlein | |
| 6,753,561 B1 | 6/2004 | Rinerson et al. | |
| 6,788,562 B2 * | 9/2004 | Nishizaka et al. | 365/63 |
| 6,795,340 B2 | 9/2004 | Sakimura et al. | |
| 6,801,448 B2 | 10/2004 | Hsu | |
| 6,807,119 B2 | 10/2004 | Fasoli et al. | |
| 6,815,781 B2 | 11/2004 | Vyvoda et al. | |
| 6,831,854 B2 | 12/2004 | Rinerson et al. | |
| 6,834,008 B2 | 12/2004 | Rinerson et al. | |
| 6,841,833 B2 | 1/2005 | Hsu et al. | |
| 6,849,905 B2 | 2/2005 | Ilkbahar et al. | |

(Continued)

FOREIGN PATENT DOCUMENTS

TW    I229865 B    3/2005

(Continued)

OTHER PUBLICATIONS

International Search Report and Written Opinion, Jan. 27, 2011, in App. No. PCT/US2010/053766, 11 pages.

*Primary Examiner* — Tuan T Nguyen
*Assistant Examiner* — Lance Reidlinger
(74) *Attorney, Agent, or Firm* — Zagorin O'Brien Graham LLP

(57) ABSTRACT

A nonvolatile memory array architecture includes a resistive element between each common source/drain (intermediate) node and data line (or bit line), in an otherwise virtual ground-like memory array having serially-connected transistors coupled to the same word line. However, every N+1 transistors the corresponding resistive element is omitted (or generally kept in a low resistance state) to form transistor strings. This achieves an array density of $4F^2*(N+1)/N$, which approaches $4F^2$ array density for reasonable values of N. Such memory arrays are well suited for use in a three-dimensional memory array having distinct memory planes stacked above each other on multiple levels above a substrate.

21 Claims, 12 Drawing Sheets

U.S. PATENT DOCUMENTS

| | | |
|---|---|---|
| 6,850,429 B2 | 2/2005 | Rinerson et al. |
| 6,856,536 B2 | 2/2005 | Rinerson et al. |
| 6,856,572 B2 | 2/2005 | Scheuerlein et al. |
| 6,859,382 B2 | 2/2005 | Rinerson et al. |
| 6,859,410 B2 | 2/2005 | Scheuerlein et al. |
| 6,862,214 B2 * | 3/2005 | Lee et al. .................. 365/163 |
| 6,879,505 B2 | 4/2005 | Scheuerlein |
| 6,881,623 B2 | 4/2005 | Campbell et al. |
| 6,906,939 B2 | 6/2005 | Rinerson et al. |
| 6,909,632 B2 | 6/2005 | Rinerson et al. |
| 6,917,539 B2 | 7/2005 | Rinerson et al. |
| 6,927,411 B2 | 8/2005 | Kozicki |
| 6,965,137 B2 | 11/2005 | Kinney et al. |
| 7,038,935 B2 | 5/2006 | Rinerson et al. |
| 7,057,922 B2 | 6/2006 | Fukumoto |
| 7,106,618 B2 | 9/2006 | Morimoto |
| 7,106,652 B2 | 9/2006 | Scheuerlein |
| 7,233,024 B2 | 6/2007 | Scheuerlein et al. |
| 7,286,439 B2 | 10/2007 | Fasoli et al. |
| 7,298,665 B2 | 11/2007 | So et al. |
| 7,345,907 B2 | 3/2008 | Scheuerlein |
| 7,362,604 B2 | 4/2008 | Scheuerlein |
| 7,426,128 B2 | 9/2008 | Scheuerlein |
| 7,436,695 B2 * | 10/2008 | Nirschl et al. .............. 365/148 |
| 7,474,555 B2 * | 1/2009 | Nirschl et al. .............. 365/163 |
| 7,505,344 B2 | 3/2009 | Scheuerlein |
| 7,529,114 B2 * | 5/2009 | Asao ........................... 365/63 |
| 7,660,148 B2 * | 2/2010 | Yokoi ......................... 365/148 |
| 7,719,882 B2 * | 5/2010 | Lin et al. .................... 365/158 |
| 2003/0047765 A1 | 3/2003 | Campbell |
| 2004/0170053 A1 | 9/2004 | Lee et al. |
| 2006/0250836 A1 | 11/2006 | Herner et al. |
| 2006/0273298 A1 | 12/2006 | Petti |
| 2007/0007579 A1 | 1/2007 | Scheuerlein et al. |
| 2010/0085822 A1 | 4/2010 | Yan et al. |
| 2010/0118590 A1 * | 5/2010 | Carter et al. ............... 365/148 |
| 2011/0075469 A1 * | 3/2011 | Wei et al. ................... 365/148 |

FOREIGN PATENT DOCUMENTS

| | | |
|---|---|---|
| TW | I231504 B | 4/2005 |
| WO | 2010109803 A1 | 9/2010 |

* cited by examiner

Cross-section of different cell technologies

NON-VOLATILE MEMORY ARRAY ARCHITECTURE INCORPORATING 1T-1R NEAR 4F² MEMORY CELL

BACKGROUND

1. Field of the Invention

The present invention relates to nonvolatile memory arrays, and particularly to those memory arrays having resistive memory elements.

2. Description of the Related Art

A variety of memory array architectures are known that incorporate programmable resistors, variable resistors, switchable resistor elements, or other resistor elements whose resistance may be varied, or whose resistance may be changed from a high resistance to a low resistance state, and may be changed back to the high resistance state, to achieve a programmable and non-volatile memory array. Such memory array architectures have not been able to achieve the array density as other types of memory, such as NAND flash arrays. However, as memory technology continues to scale to smaller geometries, resistive memory cell technologies are increasingly advantageous.

Referring now to FIG. 1, a schematic diagram is shown of a memory array 200 known in the art. Three select lines 202, 204, 206 are shown, as well as two reference lines 213, 217 and four data lines 212, 214, 216, 218. Data lines 212, 214 and reference line 213 together form line set 208, and data lines 216, 218 and reference line 217 together form line set 210. The data lines are generally parallel to the reference lines, and both are generally perpendicular to the select lines. A total of twelve different memory cells are shown associated with various ones of these array lines. For example, memory cell 220 is associated with select line 204, data line 214, and reference line 213. The memory cell 220 includes a switchable resistor memory element 222 in series with a switch device 224, together coupled between the data line 214 and the reference line 213. Semiconductor structures implementing such a memory array 200 are described in U.S. Pat. No. 7,345,907 to Roy E. Scheuerlein, entitled "Apparatus and Method for Reading an Array of Nonvolatile Memory Cells Including Switchable Resistor Memory Elements."

Referring now to FIG. 2, a schematic diagram is shown of a memory array 150 known in the art, which combines pairs of adjacent data lines described above into a single data line (bit line) which is used to access two memory cells. Three word lines (i.e., select lines) 172, 174, 176 are shown, as well as three sense lines 154, 158, 162 and three bit lines 152, 156, 160. Each memory cell includes a switchable resistor memory element in series with a switch device, together coupled between a sense line and a bit line. Such a memory array 150 is described in U.S. Pat. No. 6,801,448 to Sheng Teng Hsu, entitled "Common Bit/Common Source Line High Density 1T1R R-RAM Array."

SUMMARY

In general, and without limiting the invention in any way, the invention is directed to a nonvolatile memory array architecture which uses modifiable resistance memory elements as a non-volatile storage element, and achieves near $4F^2$ memory cell size. Conceptually, a memory array includes a resistive element between each common source/drain (intermediate) node and data line (or bit line), in a virtual ground-like array. However, every N+1 transistors the resistive element is "omitted," or is generally kept in a low resistance state, to form transistor strings having two end nodes, each string associated with N data lines between the pair of end nodes. This achieves an array density of $4F^2*(N+1)/N$, which approaches $4F^2$ array density for reasonable values of N. The memory array is well suited for use in a three-dimensional memory array having distinct memory planes stacked above each other on multiple levels above a substrate.

In one aspect the invention provides a non-volatile memory array which in certain embodiments includes: first and second word lines; a first plurality M of data lines substantially orthogonal to the first and second word lines; a first transistor string comprising a first plurality M+1 of series-connected transistors, each such transistor having a gate terminal coupled to the first word line, said first transistor string having respective first and second end nodes and having a first plurality M of intermediate nodes between adjacent transistors of the first transistor string; a first plurality M of resistive elements, each respective resistive element coupled between a respective one of the first plurality M of intermediate nodes and a respective one of the first plurality M of data lines; a second transistor string comprising a second plurality M+1 of series-connected transistors, each such transistor having a gate terminal coupled to the second word line, said second transistor string having respective first and second end nodes, and having a second plurality M of intermediate nodes between adjacent transistors of the second transistor string; and a second plurality M of resistive elements, each respective resistive element coupled between a respective one of the second plurality M of intermediate nodes and a respective one of the first plurality M of data lines.

In another aspect the invention provides a method for use in a memory array having word lines, data lines orthogonal to the word lines, and strings of series-connected transistors, individual transistors of a string having a respective gate terminal coupled to the same word line, which in certain embodiments said method includes: biasing a first word line to a selected word line level for a first mode of operation; biasing first and second end nodes of a first transistor string to a reference level for the first mode of operation, said first transistor string comprising a first plurality M+1 of series-connected transistors disposed between the first and second end nodes and having a first plurality M of intermediate nodes between adjacent transistors of the first transistor string, each such transistor having a gate terminal coupled to the first word line; and biasing a selected data line of a first plurality M of data lines associated with the first transistor string to a selected data line level for the first mode of operation which is different than the reference level, each respective one of the first plurality M of data lines being coupled by a respective one of a first plurality M of resistive elements to a respective one of the first plurality M of intermediate nodes; wherein the respective biasing of the first word line, the first and second end nodes, and the selected data line cooperate to allow current to flow from the selected data line, through a selected resistive element to an intermediate node between two adjacent transistors of the first transistor string, and simultaneously from said intermediate node to the first end node of the first transistor string, and from said intermediate node to the second end node of the first transistor string.

Each of the inventive concepts described herein can be used alone or in combination with one another. The invention in several aspects is suitable for integrated circuits having a non-volatile memory array, for methods for operating such integrated circuits and memory arrays, and for systems incorporating such non-volatile memory arrays.

The foregoing summary is illustrative only and is not intended to be in any way limiting of the invention, which is defined by the following claims. Other aspects, inventive features, and advantages of the invention may be apparent from the detailed description of the preferred embodiments set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

There are materials that have at least two distinct stable resistivity states. This class of materials can be switched from a high-resistivity state to a low-resistivity state by applying a voltage across the material having a given polarity. To switch the material from the low-resistivity state back to a high-resistivity state, a voltage having the opposite polarity can be applied.

Some of these materials can be switched between resistivity states at relatively low applied voltages, for example two volts or less. These properties would make these materials attractive for use in nonvolatile memory arrays, which retain their memory state even when power is removed from the device. Low-voltage switching is advantageous to reduce power consumption in devices, but many challenges must be overcome to provide the low voltages and reversible voltages required to operate cells incorporating such material, and to avoid accidental programming and/or erase during read.

Some materials can be reversibly switched between more than one stable resistivity state, for example between a high-resistivity state and a low-resistivity state. For certain materials, the conversion from a high-resistivity state to low-resistivity state is affected by applying a voltage of a certain magnitude, called a set voltage magnitude, in one direction, while the reverse conversion, from a low-resistivity state to a high resistivity state, is affected by applying a voltage magnitude, called a reset voltage magnitude, in the opposite direction (i.e., opposite polarity). Exemplary variable resistance materials include many cases where the set threshold voltage is less than 1 volt, and some as low as 200 mV, which make them suitable for scaling. For example, a programmable metallization cell (PMC) technology is described in U.S. Pat. No. 5,896,312 entitled "Programmable Metallization Cell Structure and Method of Making Same," the disclosure of which is hereby incorporated by reference in its entirety.

Resistive element memory cells incorporating a chalcogenide glass are described in U.S. Pat. No. 7,426,128 entitled "Switchable Resistor Memory with Opposite Polarity Write Pulses" by Roy E. Scheuerlein (hereinafter the "Scheuerlein I" application), and also described in U.S. application Ser. No. 11/179,095 entitled "Memory Cell Comprising a Thin Film Three-Terminal Switching Device Having a Metal Source and/or Drain Region" by Roy E. Scheuerlein and Christopher J. Petti (hereinafter the "Scheuerlein II" application), each of which is hereby incorporated by reference in its entirety.

Figure 1:
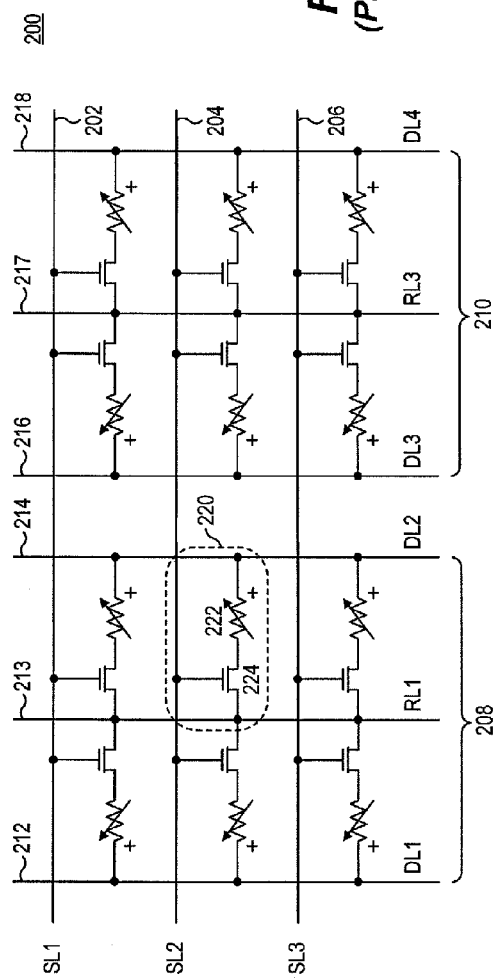
FIG. 1, labeled prior art, is a schematic diagram representing a memory array architecture known in the art.
Figure 2:
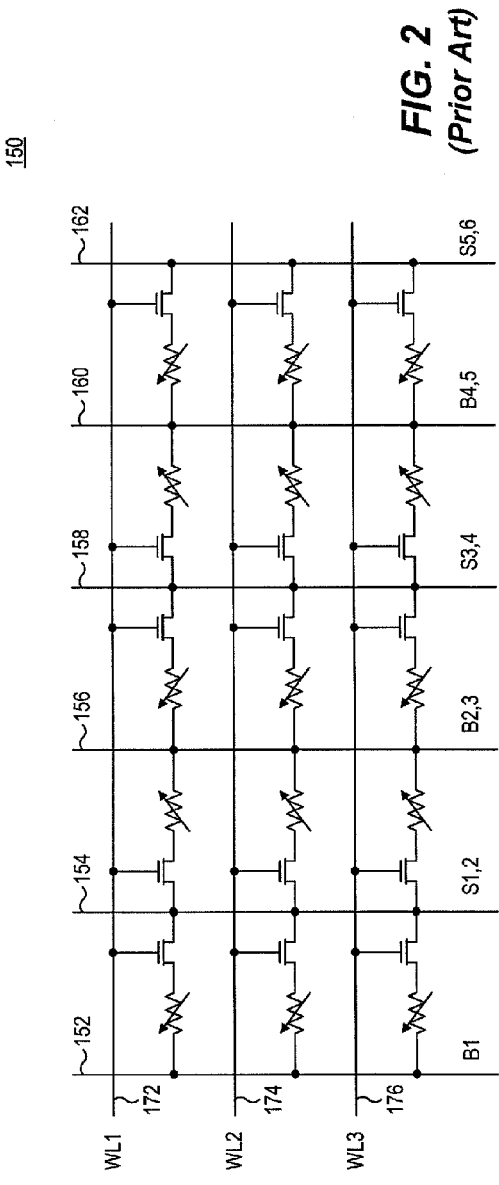
FIG. 2, labeled prior art, is a schematic diagram representing another memory array architecture known in the art.
Figure 3:
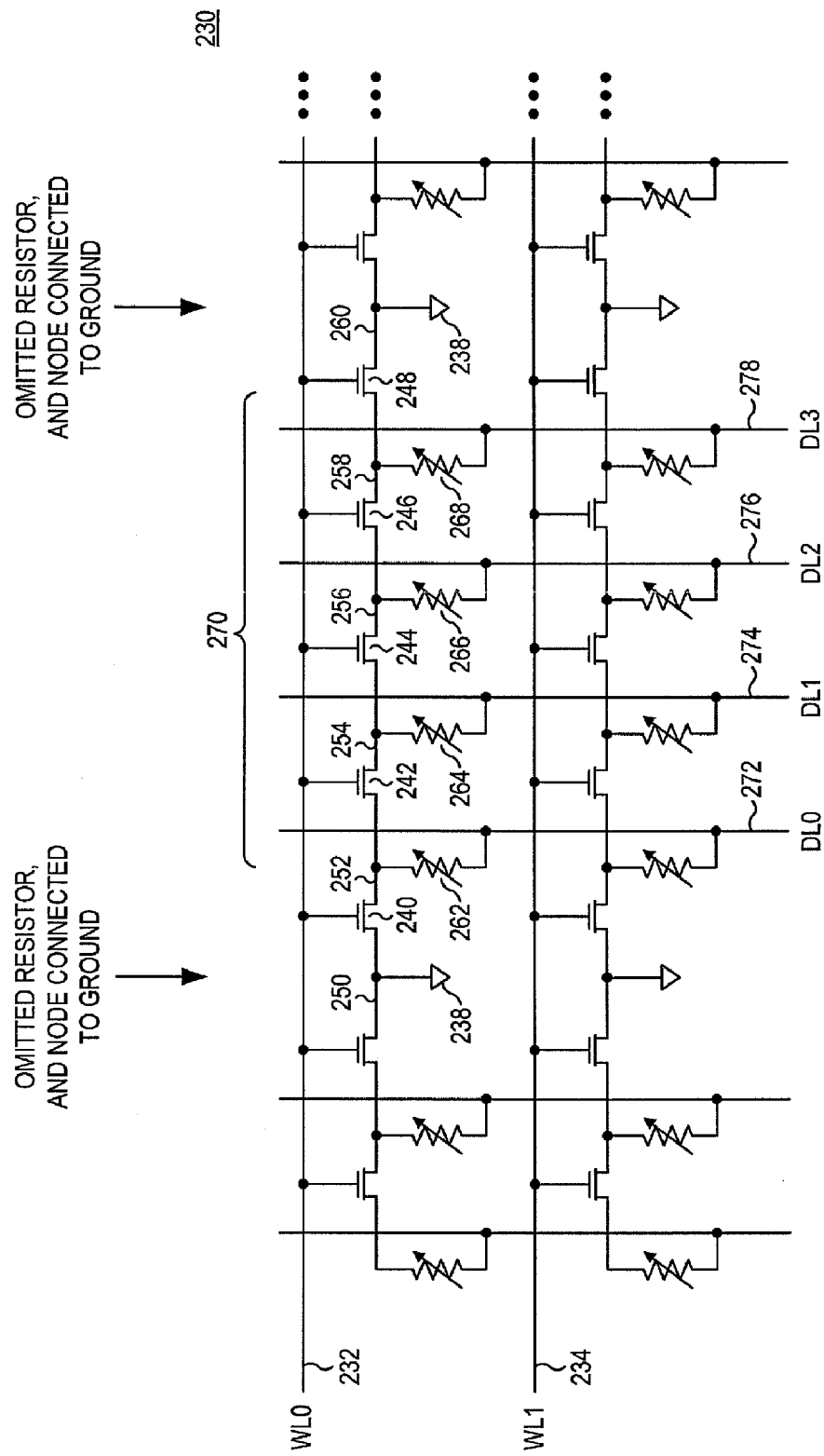
FIG. 3 is a schematic diagram of a memory array in accordance with certain embodiments of the invention.

Referring now to FIG. 3, the memory array 230 has some similarity to a virtual ground array in that a select line (or word line) is coupled to each of a plurality of transistors sharing common source/drain nodes. In a typical virtual ground array, a respective data line (or bit line) would be connected to each respective common source/drain node between adjacent transistors of a string. However, in memory array 230, a respective resistive element is coupled between each respective source/drain node (i.e., intermediate node) between adjacent transistors and each respective data line, and every N+1 transistors the resistive element is omitted (or as described below, generally kept in a low resistance state). Such a memory array achieves an array density of $4F^2*(N+1)/N$, which approaches $4F^2$ array density for achievable values of N.

In memory array 230, the common source/drain nodes from which the resistive elements are omitted are instead connected to ground, and thus define a transistor string along each select line between each pair of end nodes. For example, a first transistor string 270 associated with word line 232 extends from end node 250 to end node 260, and includes transistors 240, 242, 244, 246, 248 defining intermediate nodes 252, 254, 256, 258. Resistive elements 262, 264, 266, 268 are respectively coupled between intermediate nodes 252, 254, 256, 258 and data lines 272, 274, 276, 278. Both end nodes 250, 260 are connected to ground.

Figure 4:
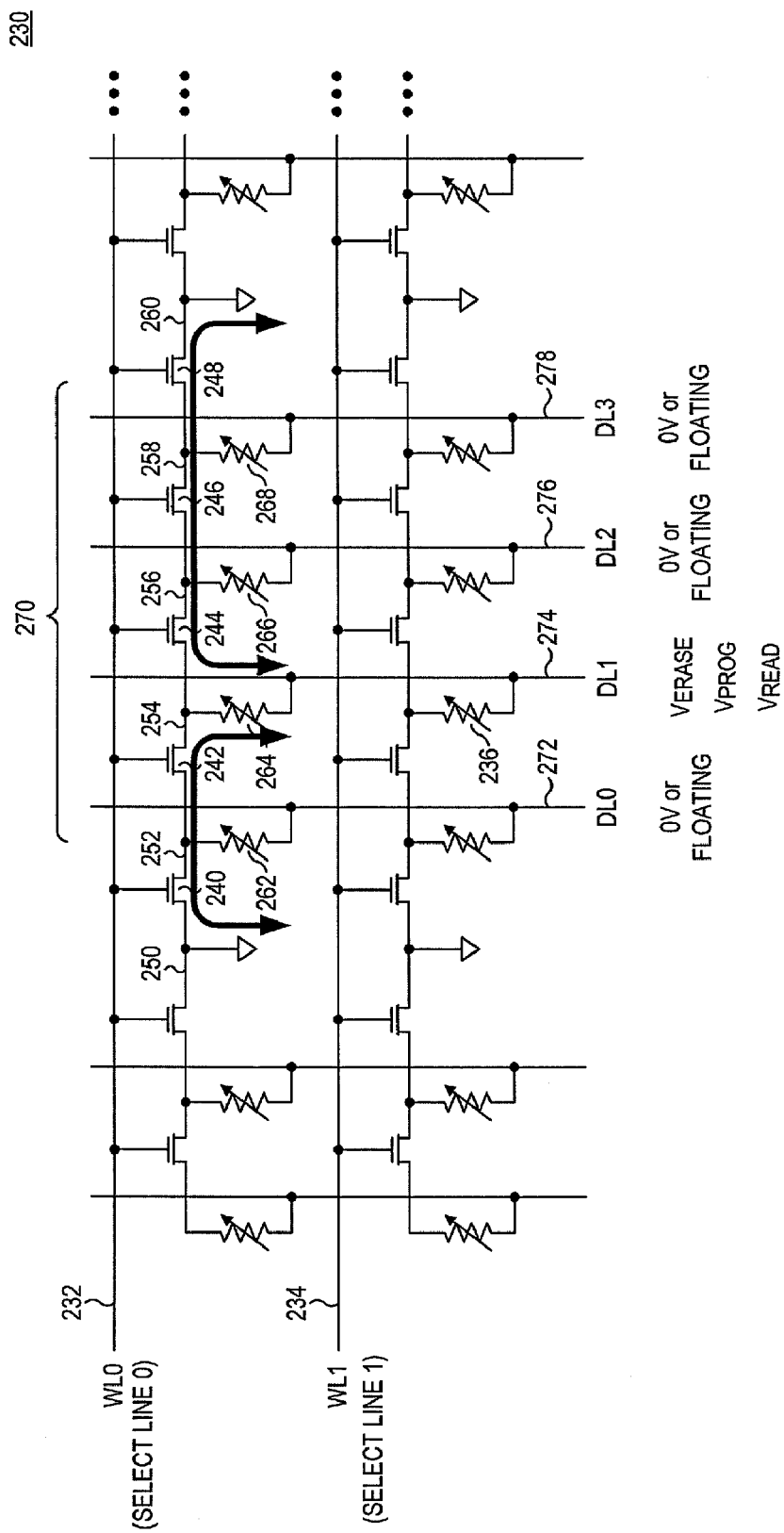
FIG. 4 is a schematic diagram helpful to describe the operation of the memory array depicted in FIG. 3.

Referring now to FIG. 4, the operation of the memory array 230 is described. To access a particular memory cell, the word line associated with that cell is driven to an appropriate selected voltage level for the given mode of operation, which turns on all the transistors in the associated strings. These transistors function as a serial access pull-down string, and provide two different current paths. One path flows to (or from) the reference node at the left end of the string, and the other current path flows to (or from) the reference node at the right end of the string.

Assume that resistive element 264 is to be accessed (e.g., read, program, or erase). Select line 232 is driven to a suitable voltage to turn on transistors 240, 242, 244, 246, and 248, and the selected data line 274 is driven to or biased at a voltage appropriate for the mode of operation of the array, such as a read voltage $V_{READ}$, a write or program voltage $V_{PROG}$, or an erase voltage $V_{ERASE}$. This provides a dual current path from the selected data line 274, through the selected resistive element 264, to each of the ground nodes 250, 260, by way of the various intermediate nodes 252, 254, 256, and 258 (or if the selected data line voltage is negative, a current into the selected data line from both ground nodes 250, 260). If the string transistors 240, 242, 244, 246, and 248 are "strong enough" (e.g., large enough, and/or turned-on well enough), the voltage of each intermediate node 252, 254, 256, 258 will be held fairly close to ground, and most of the selected data line 274 voltage will be impressed across the selected resistive element 264. The unselected data lines 272, 276, and 278 may be biased at ground or left floating, which prevents a significant voltage across the unselected resistive elements 262, 266, and 268. Consequently, negligible current will flow through the unselected elements, and none of these unselected elements will be disturbed.

Since the transistors in the string 270 are essentially in series, the voltage of a given intermediate node will depend on the distance of that node from the ground nodes (i.e., the end nodes which are connected to ground). In other words, the larger the number of transistors in the string, the string is less able to maintain the intermediate nodes at or near the ground potential, especially the intermediate node at or near the middle of the string (i.e., farthest from the ground nodes). It is important that the voltage of each such intermediate nodes 252, 256, 258 be well below the disturb voltage appropriate for the given mode of operation, otherwise accessing a selected resistive element will disturb non-selected resistive elements within the selected transistor string. Thus, while choosing a larger N (i.e., the number of transistors in the string) will improve memory array efficiency, such a memory array is more sensitive to program or erase disturb effects.

Even if some amount of memory cell disturb is unavoidable in either program or erase, such a memory array may still be operable by ensuring that such disturb effects are not too cumulative. For example, if all cells along a word line are erased periodically before any such cells are re-programmed, then there is a limited cumulative effect.

The amount of program disturb for a given memory cell is proportional to the product of the number of cells in each transistor string (which may be viewed as a "sector"), times the number of program cycles each sector is allowed to be programmed. Reducing the number N of cells per string, or reducing the number of program cycles, will reduce the disturb effects. For example, if the amount of disturb is too high, the number of program cycles may be limited to reduce this disturb. For example, for a given choice of N, if a memory cell is susceptible to being disturbed by repeated programming of other cells within the same string, the total program disturb may be improved by limiting each cell to being programmed only once, then requiring a block erase of the whole string, before any memory cells are programmed a second time. This limits the total disturb to a predictable number of cycles that any given cell is non-selected, and thus subject to disturb effects.

It should be noted that any of the read voltage $V_{READ}$, the program voltage $V_{PROG}$, or the erase voltage $V_{ERASE}$ may be either positive or negative with respect to ground, since preferably no diode or other current steering device is included in series with the resistive element in the memory cell. This affords the opportunity to utilize reversible polarity resistive elements (e.g., set/reset resistor technologies). Additionally, because the memory cell preferably does not include a series diode, lower voltages may be utilized, particularly for the program voltage $V_{PROG}$, or the erase voltage $V_{ERASE}$. For certain resistive element technologies, a useful program voltage $V_{PROG}$ may be as low as 1V, or even lower for certain PMC-type cells.

Figure 5:
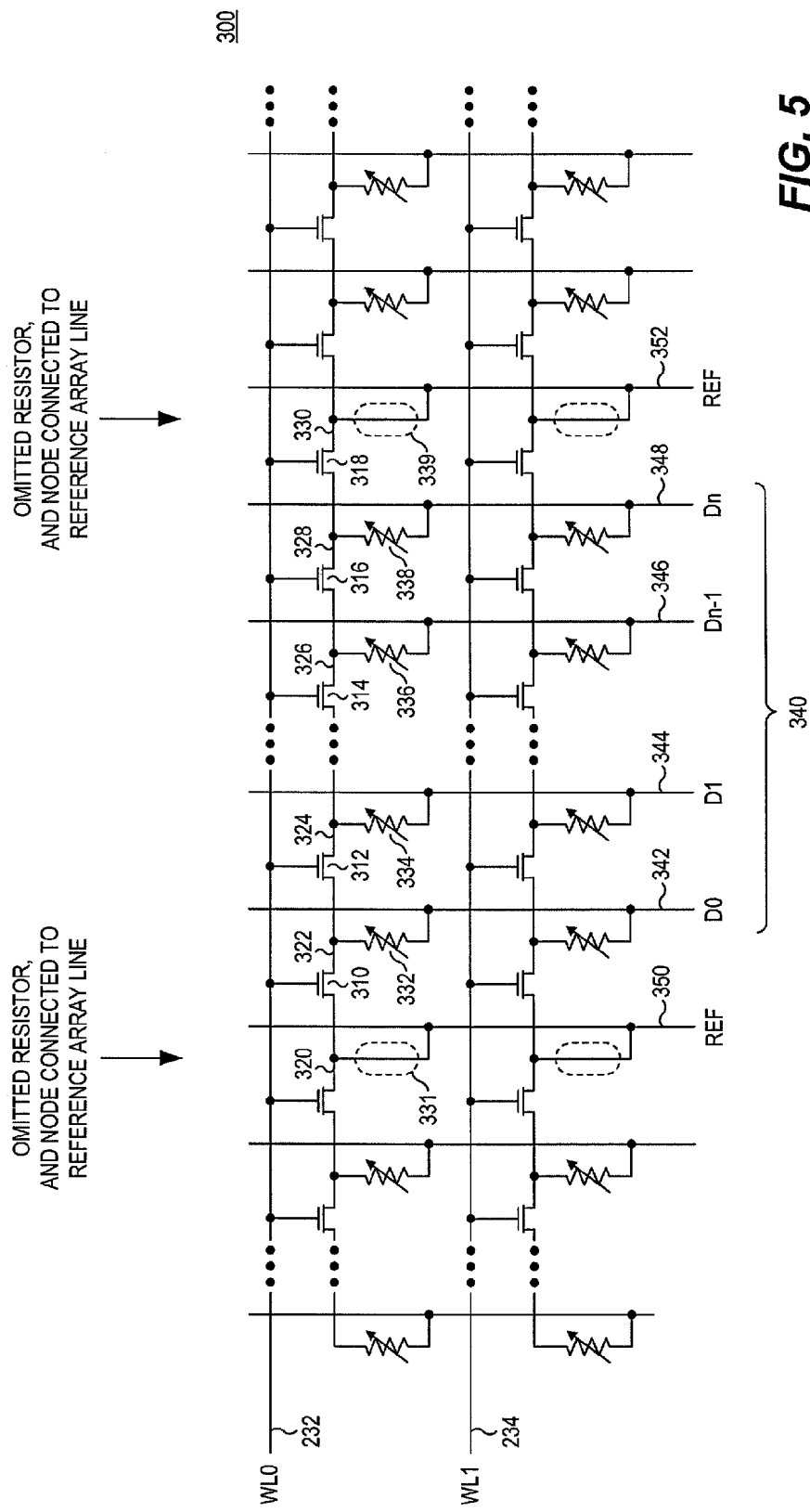
FIG. 5 is a schematic diagram of a memory array in accordance with certain embodiments of the invention.

Referring now to FIG. 5, a memory array 300 is shown which, as before, omits the resistive element every N+1 intermediate nodes to define end nodes, but connects these end nodes to reference array lines instead of to ground. For example, a first transistor string 340 associated with select line 232 extends from end node 320 to end node 330, and includes transistors 310, 312, . . . , 314, 316, 318 defining intermediate nodes 322, 324, . . . , 326, 328. Resistive elements 332, 334, . . . , 336, 338 are respectively coupled between intermediate nodes 322, 324, . . . , 326, 328 and data lines 342, 344, . . . , 346, 348. The end node 320 is connected to a reference array line 350 because the resistive element 331 otherwise present is instead omitted, while the end node 330 is connected to a reference line 352 because the resistive element 339 otherwise present is omitted.

The reference lines 350, 352 preferably traverse the array parallel to the data lines 342, 344, . . . , 346, 348, and may be fabricated similarly to the data lines, with the exception of the lack of a resistive element. This may improve the regularity of the memory array, and help achieve improved density. In operation, these reference lines 350, 352 may be biased at ground, as described above, but also may be biased at any other suitable reference voltage. For example, if such reference lines are biased at a positive reference voltage, a reversible polarity resistive element may be utilized without requiring negative voltages, such as by applying a data line voltage above the reference voltage to program (or set) the memory cell, and applying a data line voltage below the reference voltage to erase (or reset) the memory cell.

Note that each transistor string, or sector, may include four transistors, more than four transistors, or less than four transistors. For ease of decoder design, the number of transistors per string is preferably an integral power of two, but such is not required.

Figure 6:
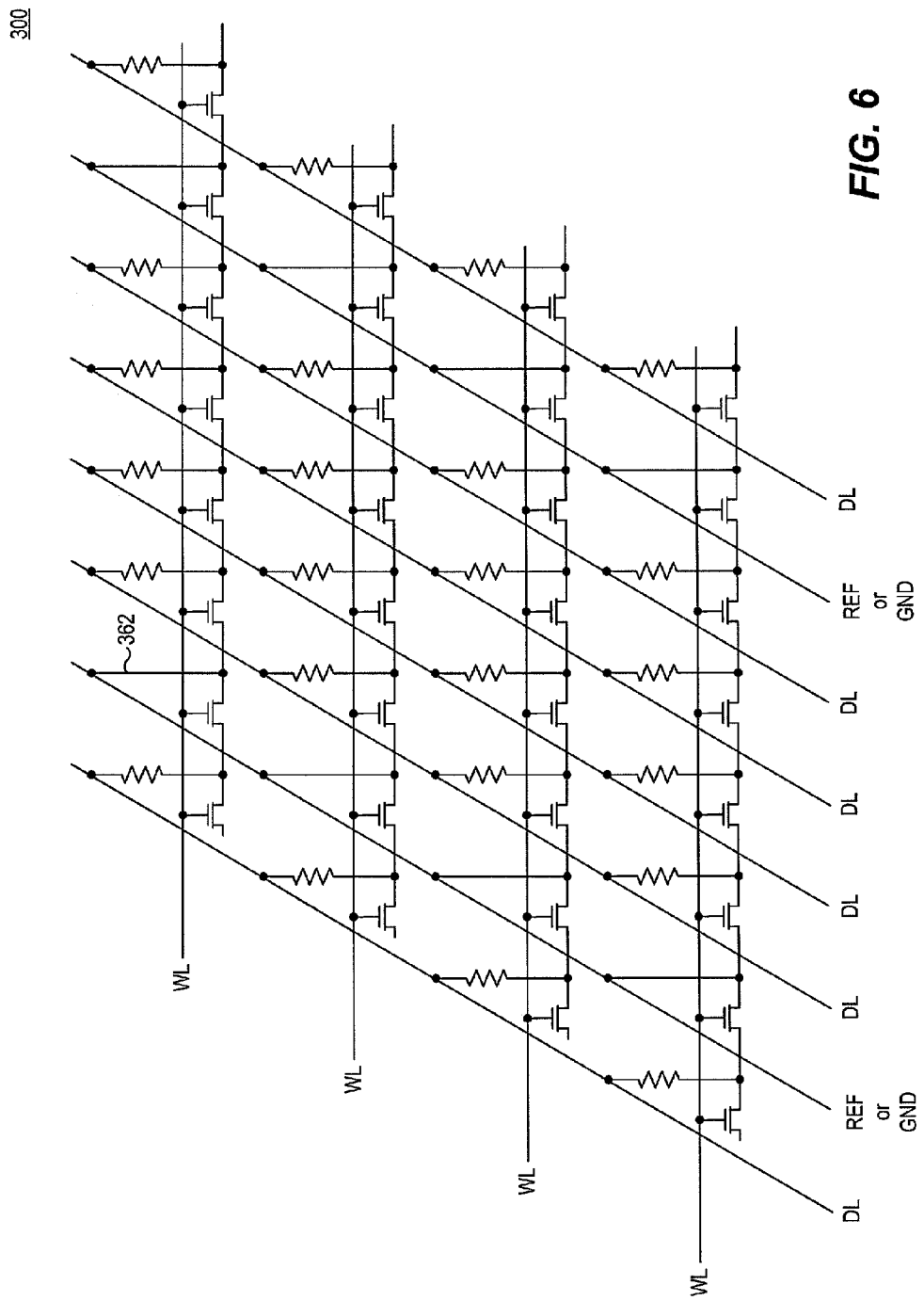
FIG. 6 is an isometric view schematic diagram of a memory array in accordance with certain embodiments of the invention.

Referring now to FIG. 6, a schematic diagram is shown in an isometric view to help describe the circuit topology of the memory array 300 shown in FIG. 5, as well as an exemplary physical topology. As this figure visually suggests, the array lines such as the data lines and the reference lines are formed above the transistor strings, and the resistive elements are vertically disposed between the common source/drain nodes of the transistor strings (i.e., the intermediate nodes of the string) and the associated data line. A vertical connection, such as via 362, connects each end node to the associated reference line. In another exemplary topology of the memory array 300 shown in FIG. 5, the data lines and reference lines may be formed below the transistor strings and associated select lines. Examples of both structures are described below.

Figure 7:
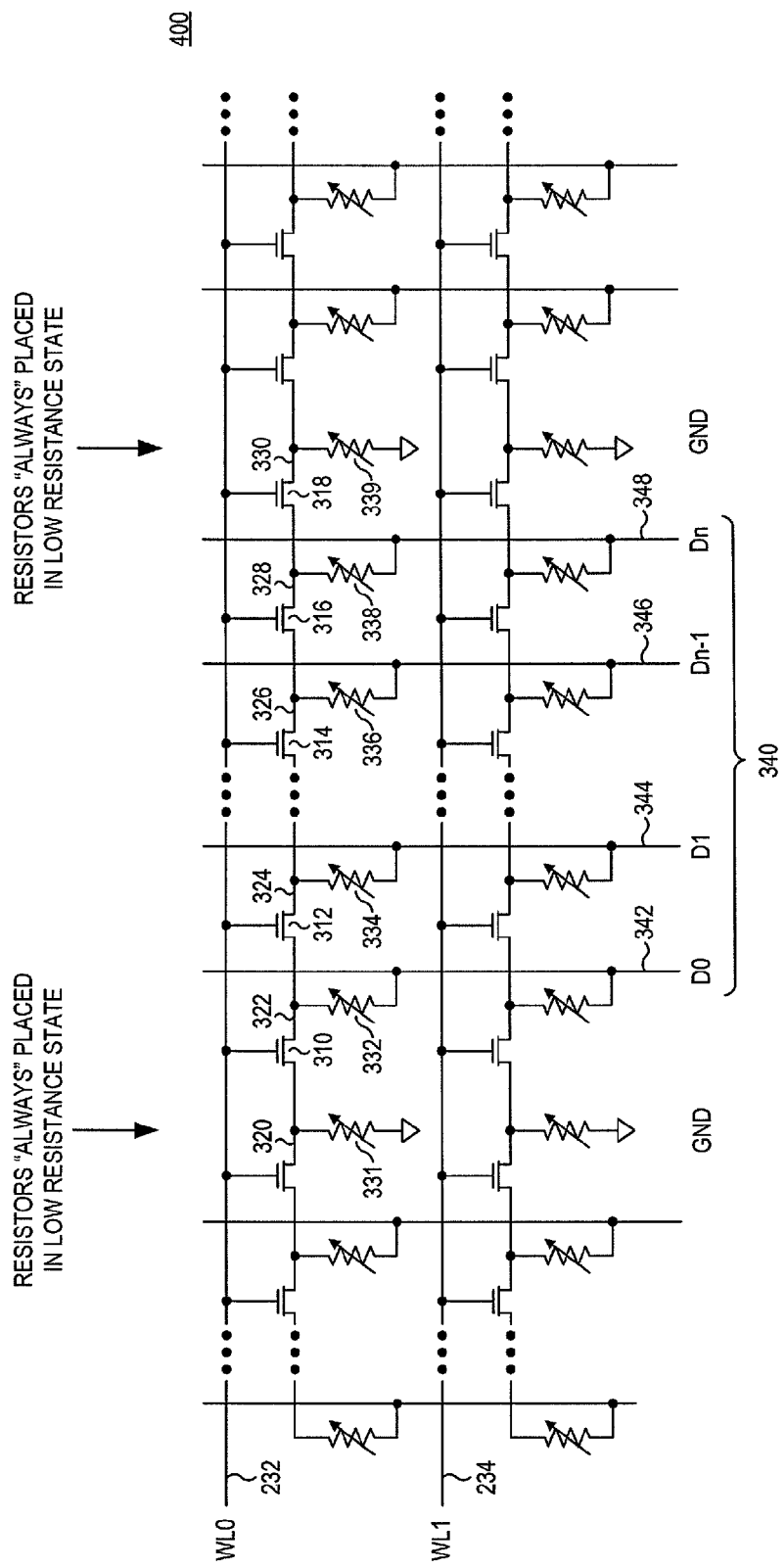
FIG. 7 is a schematic diagram of a memory array in accordance with certain embodiments of the invention.

Referring now to FIG. 7, a memory array 400 is depicted which is similar to that shown in FIG. 5, except that no resistive elements are omitted at all. Instead of removing a memory cell every N+1 transistors, this memory cell (e.g., 331, 339) remains in place but is generally maintained in a low resistance state, and is not used to store data. In this way, the end nodes of the transistor strings are coupled to ground through a low resistance "unused" memory cell. As a result, basic array operation can proceed as before.

Figure 8:
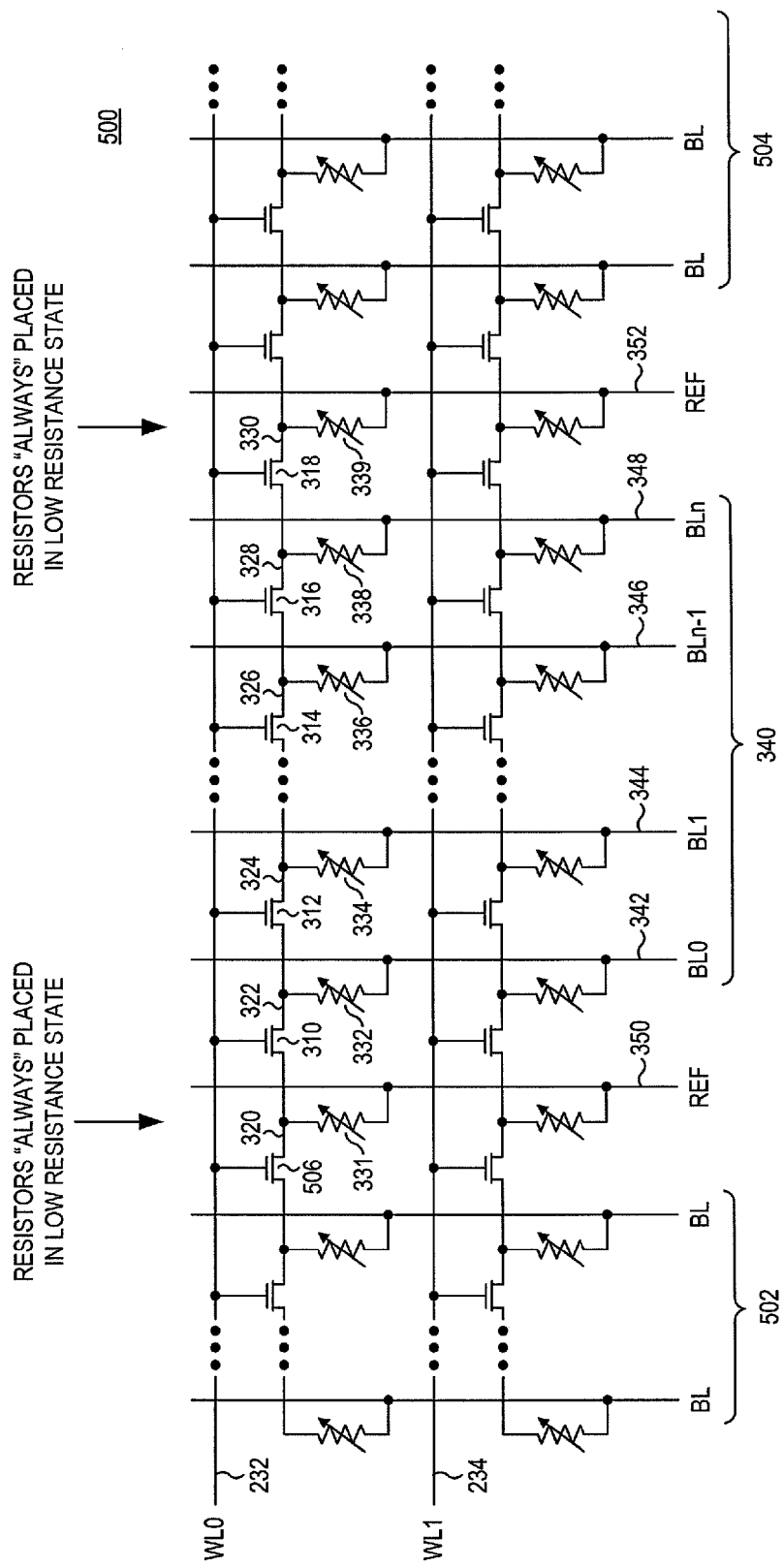
FIG. 8 is a schematic diagram of a memory array in accordance with certain embodiments of the invention.

Referring now to FIG. 8, a memory array 500 is depicted which incorporates reference lines instead of ground connections, but is otherwise identical to that shown in FIG. 7. Here, the end nodes of the transistor strings are coupled to the reference lines (e.g., ground) through a low resistance "unused" memory cell. Since the reference lines include a resistive element associated with each word line as do the data lines, an initialization or other procedure is preferably performed to ensure that the unused resistive elements associated with the reference lines are placed into a low resistance state before the memory cells associated with the data lines are ready for use. This may be accomplished, for example, by setting a pair of adjacent resistive elements on the same select line, one of which is associated with the reference line (and which will become the "unused" memory cell), and the other of which is associated with the neighboring data line on either side of the reference line (e.g., the outer-most data line of the adjacent transistor string), to their low resistance state. Then, the neighboring resistive element is reset to its high resistance state, leaving only the unused element in its low resistance state. In this example, a pair of neighboring elements are both "programmed" because there is no independent control of a single data line, unless one such data line (the reference line) already has a low resistance memory cell.

For example, during initialization, resistive element 331 (which is later to become the "unused" element) and resistive element 332 are both set, then resistive element 332 is reset. Further operation of the memory array can proceed as described above. It may be noted that this requires a programmed cell to have a very low resistance, so that the drop across the string of transistors and the unused cell does not cause any disturb. In this example, the block operation corresponds to a low-to-high transition of the resistive elements, which is followed by selectively placing the unused cells, as well as specific other resistive elements in accordance with the data to be written, into the low resistance state. Preferably, the unused resistive elements should not be "touched" during such a block operation (i.e., having a bias placed across the unused resistive elements), which would leave such unused resistive elements in their high resistance state.

As another example, consider reversing the meaning of "program" and "erase" as described above, so that the "erase" function corresponds to placing a resistor into the low resistance state (i.e., set), and the "program" function corresponds to placing a resistor into the high resistance state (i.e., reset). A memory block corresponding to one or more strings along a word line, or a portion of a word line, may be "block erased" to put all the resistive elements within the block into their respective low resistance state, including those resistive elements that correspond to the reference lines (i.e., the "unused" elements), as well as the remaining resistive elements that correspond to "architectural" bit lines actually used to store data. Then, specific memory cells may be selectively "programmed" to put such resistive cells into their respective high resistance state in accordance with the data to be written. In this example, the block operation corresponds to a high-to-low transition of the resistive elements. Such a block operation touches every memory cell, including the unused cells.

For either type of block operation, once an unused memory cell is placed in its low resistance state, it is important to ensure that the associated reference line stays at a voltage below the program disturb levels.

Such a memory array maintains its regularity of structure, even with regard to the reference lines. This affords some interesting possibilities. For example, a memory array may be fabricated without predetermining the number of transistors in each string, then "configured" after fabrication to optimize the array for speed (smaller value of N) or density (larger value of N). Moreover, a memory array may be fabricated using a process which determines the number of transistors in each string "late" in the process flow, so that inventories can be better managed. A single integrated circuit could also include two or more array configurations, each one optimized separately with a different value of N. A single memory array may include transistor strings coupled to the same word line having different values of N.

Memory array 500 also shows a one-sided transistor string 502 associated with select line 232 has a single end node 320 just "outside" transistor 506, which is common with the end node for the transistor string 340 associated with select line 232. In a broader sense, the end nodes of two adjacent transistor strings along the same select line are coupled together. Such coupling may be direct, as here, or may be indirectly through contacts, vias, or even an "extra" transistor whose gate is connected to the select line. As depicted in the memory array 500, the common end nodes of adjacent transistor strings 502 and 340 are together coupled through unused resistor 331 to the reference line 350.

In certain embodiments a memory array may include reference lines as the outer-most array lines, but such reference lines would not be shared by two transistor strings, and thus would result in a poorer array efficiency. Preferably, each reference line is shared by two adjacent transistor strings on a given word line or select line, and the out-most array lines are architectural data lines, as depicted in FIG. 8.

In certain embodiments, the reference lines may be conveniently biased at a ground potential, as are the unselected data lines, and the selected data line (for a given mode of operation) is biased at either a positive voltage to impart a positive voltage across a selected resistive element, or biased at a negative voltage to impart a negative voltage across a selected resistive element. However, the reference lines may be biased at a non-ground voltage. For example, in a given mode of operation (e.g., program, erase, etc.), the reference lines may be biased at a mid-level voltage (e.g., ½ VDD), and the selected data line biased at either a higher voltage (e.g., VDD) or a lower voltage (e.g., ground) to impart a positive voltage or a negative voltage across a selected resistive element, while maintaining all circuit voltages at a non-negative potential.

It should be noted that each of the two end nodes of each transistor string are coupled to an associated reference node which conveys the reference potential, at least at certain appropriate times (e.g., during a particular mode of operation). The end nodes may be coupled directly to a reference potential node accessible throughout the memory array, such as a plane formed on an interconnect level different than the word lines and data lines. In such a case, the reference nodes associated with each end node are one and the same reference node. In other embodiments, the end nodes may be coupled directly to an array line, thereby resulting in a dedicated reference line, or may be coupled indirectly to an array line, such as through a resistive element. In such cases, the reference nodes associated with each end node are different array lines traversing the memory array, but ultimately coupled to convey the same reference voltage to a given transistor string. Such reference lines may be connected together outside (and/or beneath) the memory array. Multiple adjacent reference lines may also be used to decrease the resistance of the reference line and thereby provide a better impedance holding the transistor string end nodes to the reference potential, although this would decrease array efficiency. A pair of adjacent reference lines may be provided in a manner that preserves the stepping regularity of the memory array by including an extra series transistor between the end nodes of two adjacent transistor strings. This extra transistor would merely short the connection between the two adjacent end nodes, and would thus still couple the adjacent end nodes together, as described above. In certain embodiments, the reference lines may be "gridded" on a different interconnect level to also provide a lower impedance to the reference voltage.

Figure 9:
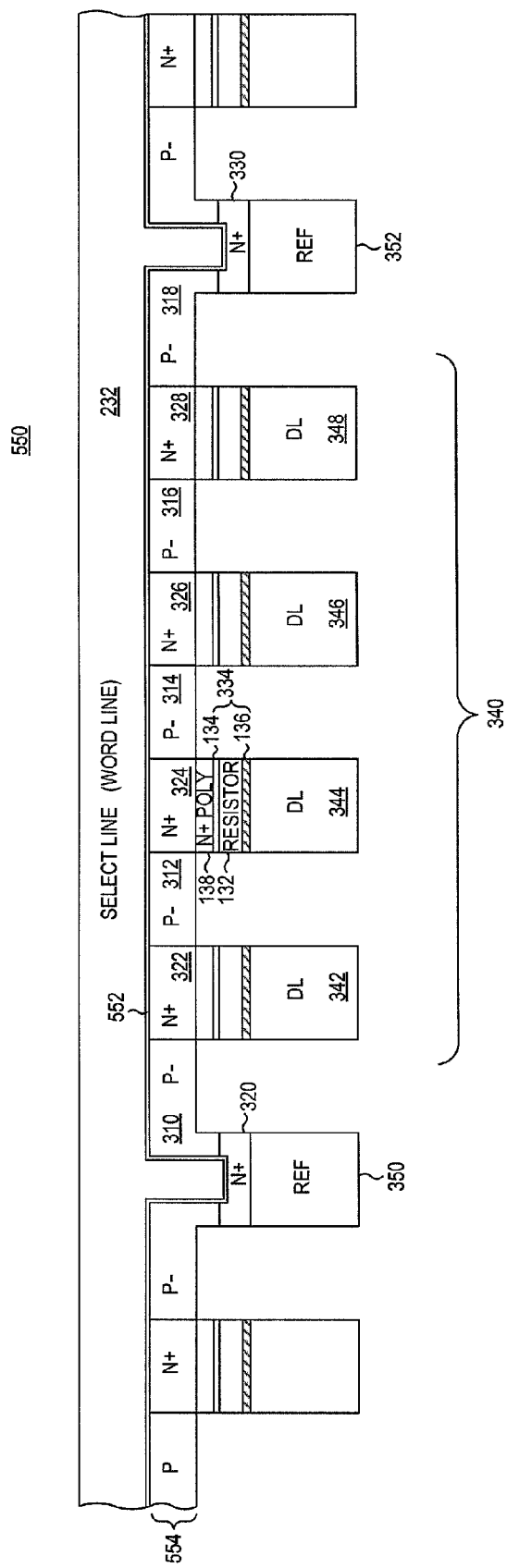
FIG. 9 is a cross-sectional view of a semiconductor structure implementing an exemplary memory array in accordance with certain embodiments of the invention.

There are a variety of physical cell structures from which such a memory array architecture may be implemented. Referring now to FIG. 9, a cross-sectional view is shown of a portion of an exemplary memory array 550 which corresponds to the array depicted in FIG. 5. Substantially parallel data lines 342, 344, 346, 348 (shown in cross section, extending out of the page) are disposed between reference lines 350, 352. Above the data lines and reference lines, and preferably extending perpendicular to them, are substantially parallel select lines 232. Such select lines 232 are coextensive with gate dielectric layer 552 and channel layer 554. Transistors 310, 312, 314, 316, 318 are respectively disposed between each pair of adjacent data lines 342, 344, 346, 348, and between each adjacent data line and reference line 350, 352. For example, transistor channel 312 is formed between N+ source/drain region 322 and source/drain region 324. A resistive element is associated with each data line. For example, resistive element 334 is disposed between source/drain region 324 and data line 344.

In certain embodiments, the switchable resistor memory element 334 includes a chalcogenide layer 132 located between two electrodes 134, 136. Chalcogenide layer 132 is amorphous, and is high-resistivity as formed, so switchable resistor memory element 334 is initially in a high-resistance state. Preferably the switchable resistor memory element 334 is a germanium containing chalcogenide. Electrode 136 is a source of mobile metal ions, preferably silver, and may be thought of as the anode electrode. Electrode 134 is any conductor which will not readily provide mobile metal ions, for example tungsten, aluminum, nickel, platinum, or heavily doped semiconductor material, and may be thought of as the cathode electrode. As can be seen, the cathode electrode is on the common source/drain side of the resistor, while the anode electrode (i.e., the reservoir of mobile ions) is on the data line rail side of the resistor. The N+ doped polysilicon layer 138 may be used to up-diffuse dopants into the channel layer 554, to form the source/drain region 324.

Each of the select transistors 310, 312, 314, 316, 318, is preferably a thin film transistor (TFT) formed of deposited Si, a Si—Ge alloy or Ge about 200 to 500 Angstroms thick, with a HDP silicon dioxide gate layer 552 and a word line 232. A TFT containing germanium or a silicon-germanium alloy can provide a lower threshold voltage and/or lower resistance switch device. It is preferable for memory cells with especially low threshold resistor material or for scaled technology where it is desirable to decrease voltages such as the select line voltage (due to the lower Vt of the device) and the drain-to-source voltage (due to the higher mobility of devices with SiGe alloys). The select line 232 may be any suitable conductor such as a doped polysilicon which is then salicided, or a tungsten-containing material. A corrugated channel reduces the short channel effect and allows very small spacing between data line rails without excessive short channel effects. Additional fabrication details of such memory cells are described more fully in the aforementioned Scheuerlein I and Scheuerlein II applications. In addition, other technologies suitable for use with the techniques described herein are described in these same applications.

The memory array 550 may also represent an exemplary structure to implement the memory array 500 depicted in FIG. 8. In such an array, each reference line is structurally identical with the data lines. For example, reference line 350 would be identical to data line 344, including its resistive element 334.

Figure 10:
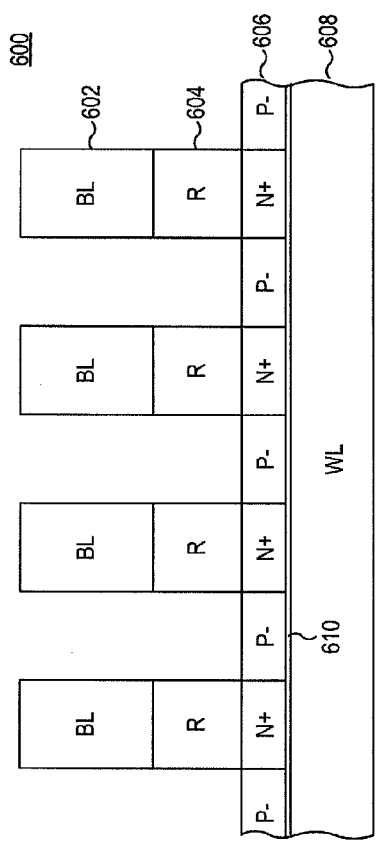
FIG. 10 is a cross-sectional view of a semiconductor structure implementing an exemplary memory array in accordance with certain embodiments of the invention.

Referring now to FIG. 10, another semiconductor structure is depicted in cross-section, which forms bit lines above the transistor strings (like that shown in FIG. 6). This structure may be viewed as an upside down TFT cell with a resistor for every cell. Exemplary structures and methods useful, with appropriate modifications, for implementing such a memory structure are described in U.S. Pat. No. 6,815,781 to Michael A. Vyvoda, et al., entitled "Inverted Staggered Thin Film Transistor with Salicided Source/Drain Structures and Method of Making Same," the disclosure of which is incorporated herein by reference in its entirety.

Figure 11:
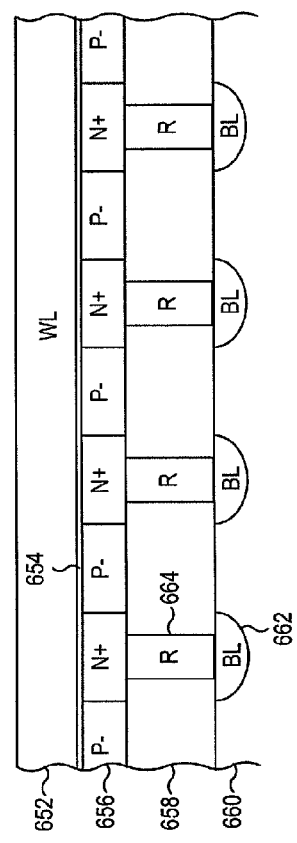
FIG. 11 is a cross-sectional view of a semiconductor structure implementing an exemplary memory array in accordance with certain embodiments of the invention.

Referring now to FIG. 11, yet another semiconductor structure is depicted in cross-section, which includes SOI transistors formed in a semiconductor layer 656 connected to buried bit lines 662 (formed in a substrate 660) via vertical resistors 664 formed in a dielectric layer 658. The select lines 652 are formed above a gate dielectric 654 to form the transistors.

Figure 12:
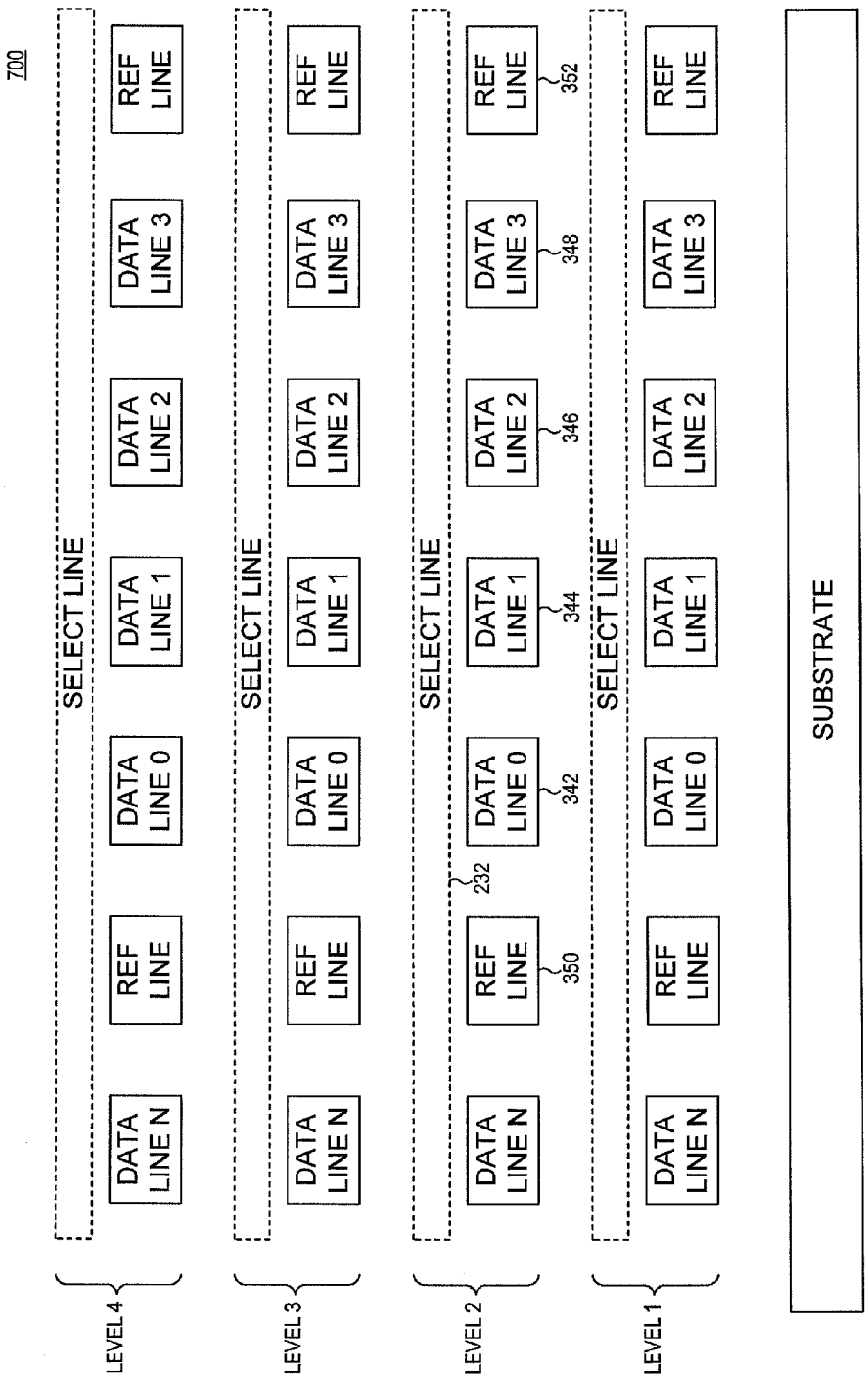
FIG. 12 is a cross-sectional view of a semiconductor structure implementing an exemplary three-dimensional memory array having multiple memory levels stacked above each other and above a semiconductor substrate, in accordance with certain embodiments of the invention.

The memory array architecture described herein is well suited for use in a three-dimensional memory array having distinct memory planes stacked above each other on multiple levels above a substrate. Referring now to FIG. 12, a cross-sectional view is shown representing array lines of a three-dimensional memory array 700. Four memory levels (i.e., "memory planes") are depicted, with each level including multiple coplanar array lines (data lines and reference lines) which are shown perpendicular to the plane of the page. Each memory level also includes a plurality of select lines (in this embodiment also described as word lines), one of which (per memory level) is shown traversing from left to right on the page. For clarity, four of the data lines are labeled consistent with the embodiment shown in FIG. 5.

In certain embodiments, the FET may be a thin-film transistor adapted to be formed in such a monolithic three-dimensional memory array having more than one level of memory cells, thus forming a highly dense memory device. In some embodiments, the memory cells may be formed at least partially in a semiconductor substrate. In other embodiments, including many of those described above, the memory cells are formed entirely in layers formed above such a substrate, including non-semiconductor substrates. Certain figures described herein may represent one memory level of such a three-dimensional memory array, and may also represent a single memory level of a two-dimensional array.

Figure 13:
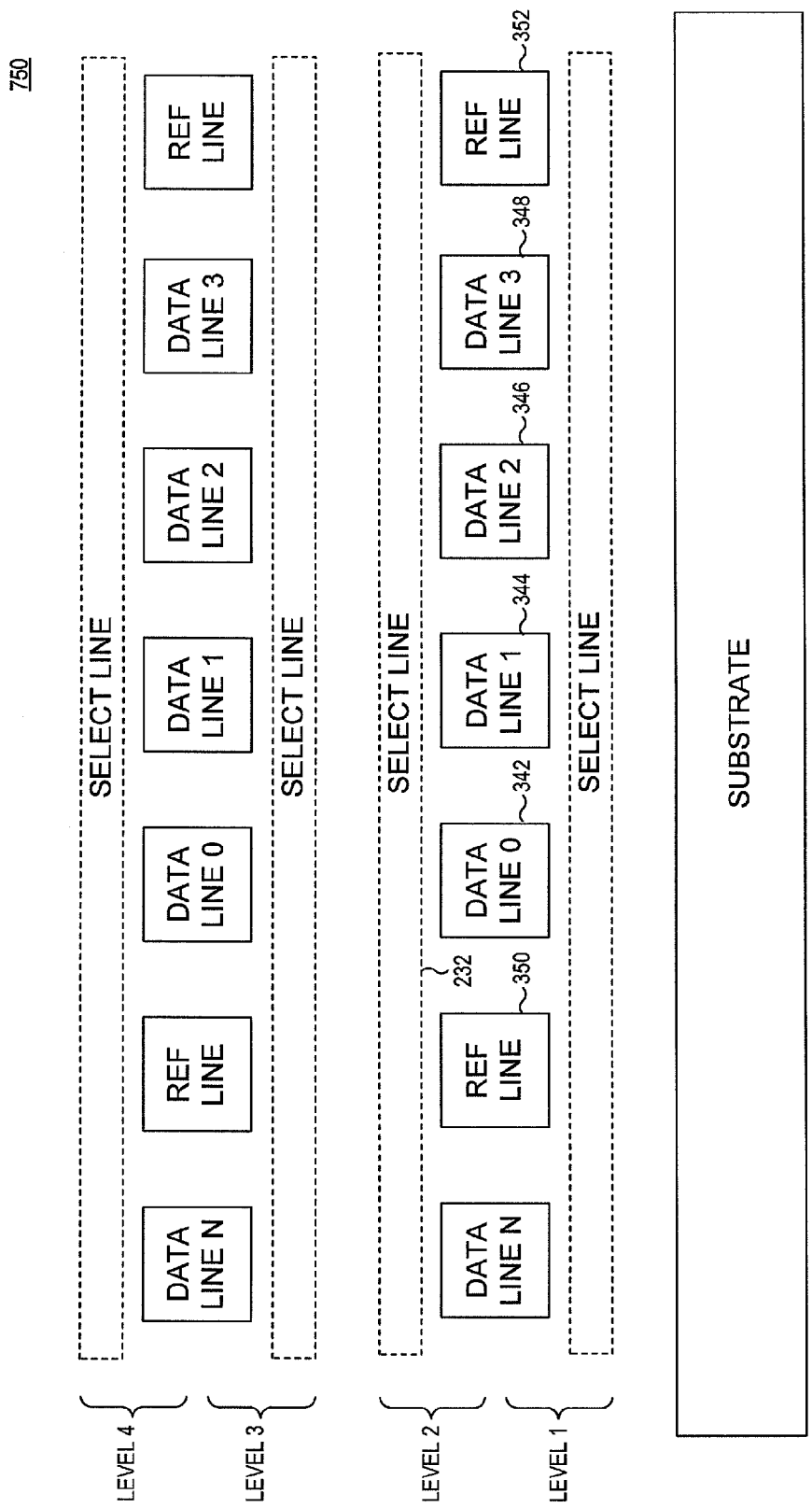
FIG. 13 is a cross-sectional view of a semiconductor structure implementing an exemplary three-dimensional memory array having multiple memory levels stacked above each other and above a semiconductor substrate, in accordance with certain embodiments of the invention.

Referring now to FIG. 13, a cross-sectional view is shown representing array lines of a three-dimensional memory array 750. Four memory levels are depicted. Each memory level also includes a plurality of select lines, one of which (per memory level) is shown traversing from left to right on the page. However, a layer of coplanar data lines and reference lines is shared by both the memory plane disposed above the data lines (i.e., at a greater height above an underlying substrate), and by the memory plane disposed below the data lines. For clarity, four of the data lines are labeled consistent with the embodiment shown in FIG. 5. Such a memory array 750 may be implemented, for example, by stacking a memory plane as shown in FIG. 9 above the memory plane shown in FIG. 10, with the reference and data lines in common between both memory planes. Other memory cell technologies, as noted herein, may also be used to implement such a vertically-shared data line array.

Figure 14:
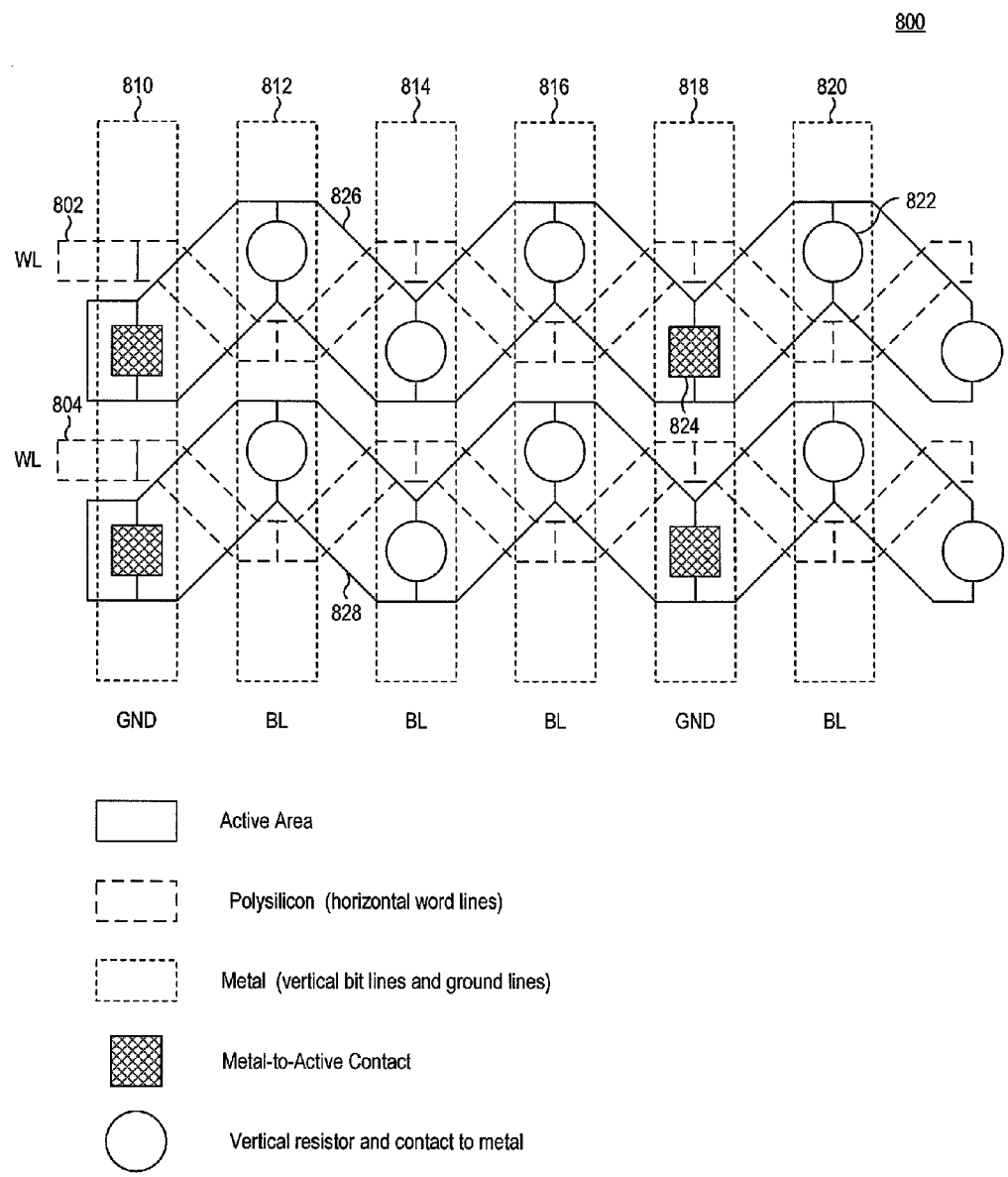
FIG. 14 is a plan view of a semiconductor layout of an exemplary memory array in accordance with certain embodiments of the invention.

Referring now to FIG. 14, a plan view of a semiconductor layout is depicted of an exemplary memory array 800 which may be implemented using transistors formed in a semiconductor substrate, such as a two-dimensional (i.e., single memory plane) memory array. Two word lines 802, 804 are shown traversing horizontally across the array 800, forming a transistor at every intersection with active areas 826, 828. Reference lines 810, 818 and bit lines 812, 814, 816, 820 are shown traversing vertically above the word lines. Each respective intersection of bit lines 812, 814, 816, 820 and active areas 826, 828 includes a respective vertical resistive element (such as that labeled 822) coupled therebetween. Each respective intersection of reference lines 810, 818 and active areas 826, 828 (i.e., the transistor string "end nodes") includes a respective metal-to-active contact (such as that labeled 824) coupled therebetween. In other embodiments, the reference lines may be coupled to the active area end nodes by an identical resistive element as those coupled between the intermediate nodes and the data lines.

In the various embodiments described above, the select lines may be thought of as word lines, and the data lines may be thought of as bit lines. While such terminology is believed to be widely adopted by many in the art for many types of memory array structures, such terminology may imply, to some, a particular organization of the memory array, such as word width, page size, block size, etc., which may be limiting and is unintended herein. As used herein, the use of terms such as select lines and data lines is not meant to connote any distinction over the terms word lines and bit lines. In addition, certain reference lines in some embodiments may be described as ground lines, but it should be understood that such lines are more generally viewed as reference lines, which may or may not be coupled to ground.

The non-volatile memory array structures and techniques described herein are contemplated for use with any of a wide variety of two-terminal non-volatile electrically controllable resistors, including those whose resistance may be continuously varied by application of particular voltage/current conditions, and including those whose resistance may be placed into either of two stable resistance states by application of particular voltage/current conditions, which are all collectively referred to herein as "resistive elements" and/or "resistor elements" without any intent to exclude certain types of such resistor technologies and structures. The various bias conditions would depend upon the resistor technology chosen, and the operating modes provided. Many different kinds of resistive elements that may be used effectively with the techniques described herein are described in co-pending U.S. application Ser. No. 12/563,140 filed Sep. 20, 2009 entitled "Continuous Programming of Non-Volatile Memory" by Tianhong Yan and Luca Fasoli, the disclosure of which is incorporated herein by reference in its entirety. In addition, PMC cells referenced above may be used effectively with the techniques described herein. Moreover, while resistive elements having no diode are specifically contemplated, other resistive elements that may include a diode or other steering device may be used effectively with the techniques described herein.

Another monolithic three dimensional memory array comprising transistors and resistance-switching memory elements is described in Petti, U.S. patent application Ser. No. 11/143,269, entitled "Rewriteable Memory Cell Comprising a Transistor and Resistance-Switching Material in Series," filed Jun. 2, 2005, owned by the assignee of the present invention, and hereby incorporated by reference. The resistance switching materials described therein are both set and reset with the same polarity of voltage. A risk of read disturb arises from the very low reset voltage that changes the low-resistance state to the high-resistance state. Such memory cells are likewise advantageously read with a read voltage that is opposite in polarity than the set voltage. In this case, the read voltage may be opposite in polarity than both the set and reset voltages.

As used herein, the SET state is assumed to be a low-resistance state, while the RESET state is assumed to be a high-resistance state. The SET action is for placing the memory cell resistor to the SET state; likewise for RESET action is for placing the memory cell resistor to the RESET state. The SET threshold is in a forward direction, and RESET threshold in a reverse direction. While the terms "program" and "erase" may be frequently associated, respectively, with "set" and "reset," the examples described above confirm that such association is not required. For example, as noted above, a block erase function may correspond to "setting" all the resistive elements in certain embodiments, but may correspond to "resetting" all the resistive elements in other embodiments. As such, the terms "program" and "erase" should be clear in the contexts as used herein, and should not be interpreted restrictively to imply a particular bias condition or particular state change of the resistive elements, nor to necessarily correspond to such terms as used in product datasheets or literature.

The phrases "programming a memory cell to a set state" and "programming the switchable resistor memory element within a memory cell to a set state" and "programming a memory cell to a low-resistance state" and "programming the switchable resistor memory element within a memory cell to a low-resistance state" and "placing the resistive element within a memory cell to a low-resistance state" may be used interchangeably herein, and no subtle distinctions should be inferred from such use, even if, from a user perspective, such action is described using terms such as "reset" or "erase" or "block erase".

In most preferred embodiments, memory array support is formed in the substrate beneath the memory, and electrical connections must be made from the ends of the data lines, reference lines, and select lines of the array to this circuitry. An advantageous scheme for making these connections while minimizing use of substrate area is described in Scheuerlein et al., U.S. Pat. No. 6,879,505, "Word Line Arrangement Having Multi-Layer Word Line Segments for Three-Dimensional Memory Array," which is hereby incorporated by reference. Moreover, in certain embodiments, such support circuitry may include select line decoders and data line decoders arranged in a checkerboard fashion beneath a three-dimensional memory array formed above a substrate. Additional information regarding exemplary checkerboard arrangements may be found in U.S. Pat. No. 6,735,104, issued May 11, 2004, which is hereby incorporated by reference in its entirety.

As used herein, "coupled" means directly or indirectly, such as through intervening components or structures. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, and a word line and bit line within the selected block, based upon address signals and possibly other control signals. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium. An encoding of a circuit may include circuit schematic information, physical layout information, behavioral simulation information, and/or may include any other encoding from which the circuit may be represented or communicated.

The foregoing description has described only a few of the many possible implementations of the present invention. For this reason, this detailed description is intended by way of illustration, and not by way of limitation. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A memory array comprising:
   first and second word lines;
   a first plurality M of data lines substantially orthogonal to the first and second word lines;
   a first transistor string comprising a first plurality M+1 of series-connected transistors, each such transistor having a gate terminal coupled to the first word line, said first transistor string having respective first and second end nodes and having a first plurality M of common source/drain nodes between and shared by adjacent transistors of the first transistor string;
   a first plurality M of resistive elements, each respective resistive element coupled between a respective one of the first plurality M of common source/drain nodes and a respective one of the first plurality M of data lines;
   a second transistor string comprising a second plurality M+1 of series-connected transistors, each such transistor having a gate terminal coupled to the second word line, said second transistor string having respective first and second end nodes, and having a second plurality M of common source/drain nodes between and shared by adjacent transistors of the second transistor string; and
   a second plurality M of resistive elements, each respective resistive element coupled between a respective one of the second plurality M of common source/drain nodes and a respective one of the first plurality M of data lines;
   wherein each respective common source/drain node within the first and second transistor strings is shared only by the respective adjacent transistors and the respective resistive element coupled thereto.

2. The memory array as recited in claim 1 wherein:
   each of the respective first and second end nodes of the respective first and second transistor strings is coupled to an associated reference node for conveying, at times, a reference voltage to the respective first and second end nodes of the respective first and second transistor strings.

3. The memory array as recited in claim 2 wherein:
   the associated reference node coupled to the first end node of the first transistor string comprises a first reference line disposed parallel to the first plurality M of data lines;
   the associated reference node coupled to the second end node of the first transistor string comprises a second reference line disposed parallel to the first plurality M of data lines; and
   the associated reference node coupled to the first end node of the second transistor string comprises the first reference line;
   the associated reference node coupled to the second end node of the second transistor string comprises the second reference line; and
   the first plurality M of data lines is disposed between the first and second reference lines.

4. The memory array as recited in claim 3 further comprising:

a second plurality N of data lines substantially orthogonal to the first and second word lines;

a third transistor string comprising a third plurality N+1 of series-connected transistors, each such transistor having a gate terminal coupled to the first word line, said third transistor string having respective first and second end nodes, and having a third plurality N of common source/drain nodes between and shared by adjacent transistors of the third transistor string;

a third plurality N of resistive elements, each respective resistive element coupled between a respective one of the third plurality N of common source/drain nodes and a respective one of the second plurality N of data lines; and a third reference line parallel to the second plurality N of data lines and coupled to the second end node of the third transistor string;

wherein each respective common source/drain node within the third transistor string is shared only by the respective adjacent transistors and the respective resistive element coupled thereto;

wherein the first end node of the third transistor string is coupled to the second end node of the first transistor string; and wherein the second plurality N of data lines is disposed between the second and third reference lines.

5. The memory array as recited in claim 4 wherein M is not equal to N.

6. A memory array comprising:

first and second word lines;

a first plurality M of data lines substantially orthogonal to the first and second word lines;

a first transistor string comprising a first plurality M+1 of series-connected transistors, each such transistor having a gate terminal coupled to the first word line, said first transistor string having respective first and second end nodes and having a first plurality M of common source/drain nodes between and shared by adjacent transistors of the first transistor string;

a first plurality M of resistive elements, each respective resistive element coupled between a respective one of the first plurality M of common source/drain nodes and a respective one of the first plurality M of data lines;

a second transistor string comprising a second plurality M+1 of series-connected transistors, each such transistor having a gate terminal coupled to the second word line, said second transistor string having respective first and second end nodes, and having a second plurality M of common source/drain nodes between and shared by adjacent transistors of the second transistor string; and a second plurality M of resistive elements, each respective resistive element coupled between a respective one of the second plurality M of common source/drain nodes and a respective one of the first plurality M of data lines;

wherein each of the respective first and second end nodes of the respective first and second transistor strings is coupled to an associated reference node for conveying, at times, a reference voltage to the respective first and second end nodes of the respective first and second transistor strings;

wherein the associated reference node coupled to the first end node of the first transistor string comprises a first reference line disposed parallel to the first plurality M of data lines;

wherein the associated reference node coupled to the second end node of the first transistor string comprises a second reference line disposed parallel to the first plurality M of data lines;

wherein the associated reference node coupled to the first end node of the second transistor string comprises the first reference line;

wherein the associated reference node coupled to the second end node of the second transistor string comprises the second reference line;

wherein the first plurality M of data lines is disposed between the first and second reference lines; and wherein the respective first and second reference lines are directly connected to the respective first and second end nodes of the first and second transistor strings.

7. A memory array comprising:

first and second word lines;

a first plurality M of data lines substantially orthogonal to the first and second word lines;

a first transistor string comprising a first plurality M+1 of series-connected transistors, each such transistor having a gate terminal coupled to the first word line, said first transistor string having respective first and second end nodes and having a first plurality M of common source/drain nodes between and shared by adjacent transistors of the first transistor string;

a first plurality M of resistive elements, each respective resistive element coupled between a respective one of the first plurality M of common source/drain nodes and a respective one of the first plurality M of data lines;

a second transistor string comprising a second plurality M+1 of series-connected transistors, each such transistor having a gate terminal coupled to the second word line, said second transistor string having respective first and second end nodes, and having a second plurality M of common source/drain nodes between and shared by adjacent transistors of the second transistor string; and a second plurality M of resistive elements, each respective resistive element coupled between a respective one of the second plurality M of common source/drain nodes and a respective one of the first plurality M of data lines;

wherein each of the respective first and second end nodes of the respective first and second transistor strings is coupled to an associated reference node for conveying, at times, a reference voltage to the respective first and second end nodes of the respective first and second transistor strings;

wherein the associated reference node coupled to the first end node of the first transistor string comprises a first reference line disposed parallel to the first plurality M of data lines;

wherein the associated reference node coupled to the second end node of the first transistor string comprises a second reference line disposed parallel to the first plurality M of data lines;

wherein the associated reference node coupled to the first end node of the second transistor string comprises the first reference line;

wherein the associated reference node coupled to the second end node of the second transistor string comprises the second reference line;

wherein the first plurality M of data lines is disposed between the first and second reference lines;

and further comprising a plurality of reference line resistive elements, each coupling a respective one of the first and second end nodes of a respective one of the first and second transistor strings to its associated reference node.

8. The memory array as recited in claim 7 wherein:
each of the first and second reference lines is identical in structure to individual ones of the first plurality M of data lines; and
each of the plurality of reference line resistive elements is identical in structure to individual ones of the first plurality M of resistive elements.

9. The memory array as recited in claim 8 wherein:
the value of M is configurable so that the number of transistors comprising a given transistor string may be selected post-manufacture.

10. A method for use in a memory array having word lines, data lines orthogonal to the word lines, and strings of series-connected transistors, individual transistors of a string having a respective gate terminal coupled to the same word line, said method comprising:
biasing a first word line to a selected word line level for a first mode of operation;
biasing first and second end nodes of a first transistor string to a reference level for the first mode of operation, said first transistor string comprising a first plurality M+1 of series-connected transistors disposed between the first and second end nodes and having a first plurality M of intermediate nodes between adjacent transistors of the first transistor string, each such transistor having a gate terminal coupled to the first word line; and
biasing a selected data line of a first plurality M of data lines associated with the first transistor string to a selected data line level for the first mode of operation which is different than the reference level, each respective one of the first plurality M of data lines being coupled by a respective one of a first plurality M of resistive elements to a respective one of the first plurality M of intermediate nodes;
wherein the respective biasing of the first word line, the first and second end nodes, and the selected data line cooperate to allow current to flow from the selected data line, through a selected resistive element to an intermediate node between two adjacent transistors of the first transistor string, and simultaneously from said intermediate node to the first end node of the first transistor string, and from said intermediate node to the second end node of the first transistor string.

11. The method as recited in claim 10 further comprising:
biasing unselected data lines of the first plurality M of data lines associated with the first transistor string and disposed between the first and second end nodes to an unselected data line bias condition for the first mode of operation chosen to prevent significant voltage across each respective resistive element associated with each respective unselected data line and with the first transistor string.

12. The method as recited in claim 11 wherein the unselected data line bias condition for the first mode of operation comprises a floating condition.

13. The method as recited in claim 11 wherein the unselected data line bias condition for the first mode of operation comprises a voltage substantially equal to the reference level.

14. The method as recited in claim 11 further comprising:
biasing the first word line to a selected word line level for a second mode of operation;
biasing first and second end nodes of the first transistor string to a reference level for the second mode of operation;
biasing a selected data line of the first plurality M of data lines associated with the first transistor string to a selected data line level for the second mode of operation;
wherein the respective biasing of the first word line, the first and second end nodes, and the selected data line cooperate to allow current to flow simultaneously from both the first and second end nodes to an intermediate node between two adjacent transistors of the first transistor string, then through a selected resistive element to the selected data line.

15. The method as recited in claim 11 wherein biasing the first and second end nodes of the first transistor string comprises:
biasing first and second array lines respectively coupled to the first and second end nodes of the first transistor string to the reference level for the first mode of operation, said first and second array lines disposed parallel to the first plurality M of array lines associated with the first transistor string.

16. The method as recited in claim 15 wherein:
the first and second array lines respectively comprise first and second reference lines directly connected to the respective first and second end nodes of the first transistor string.

17. The method as recited in claim 15 wherein:
the first and second array lines are respectively coupled to the respective first and second end nodes of the first transistor string by way of respective first and second resistive elements; and
the method further comprises generally maintaining the first and second resistive elements in a low resistance state rather than storing data into the first and second resistive elements.

18. The method as recited in claim 17 further comprising:
selecting the value of M so that the number of transistors comprising a given transistor string may be selected post-manufacture;
wherein each of the first and second array lines is identical in structure to individual ones of the first plurality M of data lines; and
wherein each of the first and second resistive elements is identical in structure to individual ones of the first plurality M of resistive elements.

19. The method as recited in claim 11 further comprising:
performing a block operation to place the first and second resistive elements and each of the first plurality M of resistive elements into a low resistance state; then
selectively placing individual ones of the first plurality M of resistive elements into a high resistance state in accordance with data to be written into the memory array.

20. The method as recited in claim 11 further comprising:
performing a block operation to place the first and second resistive elements and each of the first plurality M of resistive elements into a high resistance state; then
placing the first and second resistive elements into a low resistance state; and
selectively placing individual ones of the first plurality M of resistive elements into a low resistance state in accordance with data to be written into the memory array.

21. The method as recited in claim 10 wherein:
each of said first plurality M of intermediate nodes between adjacent transistors of the first transistor string comprises a common source/drain node shared by adjacent transistors of the first transistor string.

* * * * *